(12) United States Patent
Takahashi

(10) Patent No.: US 6,168,890 B1
(45) Date of Patent: Jan. 2, 2001

(54) MEMBERS FOR MASK PRODUCTION, MASKS, AND METHODS THEREOF FOR MANUFACTURING SAME

(75) Inventor: Shinichi Takahashi, Tokyo (JP)

(73) Assignee: Nikon Corporation, Tokyo (JP)

( * ) Notice: Under 35 U.S.C. 154(b), the term of this patent shall be extended for 0 days.

(21) Appl. No.: 09/204,624

(22) Filed: Dec. 1, 1998

(30) Foreign Application Priority Data

Dec. 1, 1997 (JP) .................................................... 9-330668

(51) Int. Cl.$^7$ .................................. G03F 9/00; G03C 5/00
(52) U.S. Cl. .................................................. 430/5; 430/296
(58) Field of Search .............................. 430/5, 296, 322; 378/35; 438/514; 117/928

(56) References Cited

U.S. PATENT DOCUMENTS

| | | | |
|---|---|---|---|
| 5,082,695 | * | 1/1992 | Yamada et al. ........................... 430/5 |
| 5,523,580 | * | 6/1996 | Davis ........................................ 430/5 |
| 5,672,449 | * | 9/1997 | Loschner et al. ........................ 430/5 |
| 5,935,739 | * | 8/1999 | Bayer et al. ............................. 430/5 |

FOREIGN PATENT DOCUMENTS 7-86117    3/1995    (JP) .

* cited by examiner

*Primary Examiner*—S. Rosasco
(74) *Attorney, Agent, or Firm*—Klarquist Sparkman Cambell Leigh & Whinston, LLP

(57) ABSTRACT

Substrates are disclosed for forming a microlithographic mask having a thin membrane. Also disclosed are masks formed from such substrates. The masks preferably include a support member to support the membrane, the membrane defining the mask pattern. The support member can be configured as a network of supporting struts fused to a mask membrane. The mask membrane preferably includes a thin crystalline layer (e.g., silicon) containing an impurity (dopant). Each atom of the impurity has an atomic radius that is smaller than the atomic radius of atoms of the crystalline material. Also disclosed are methods for manufacturing such substrates and masks.

19 Claims, 5 Drawing Sheets

FIG. 4(a) (Prior Art)
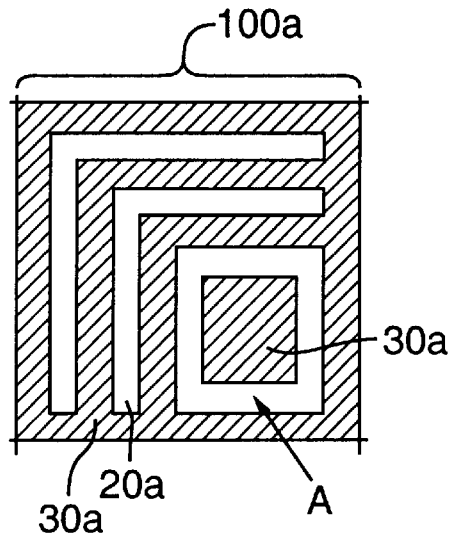
FIG. 4(c) (Prior Art)
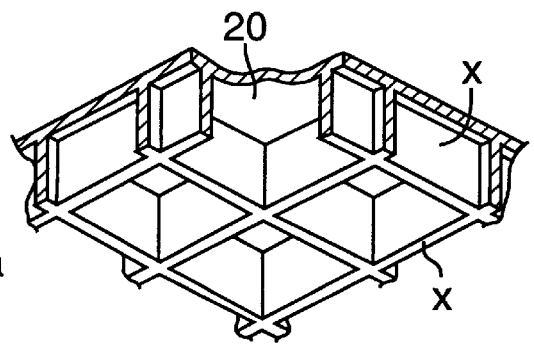
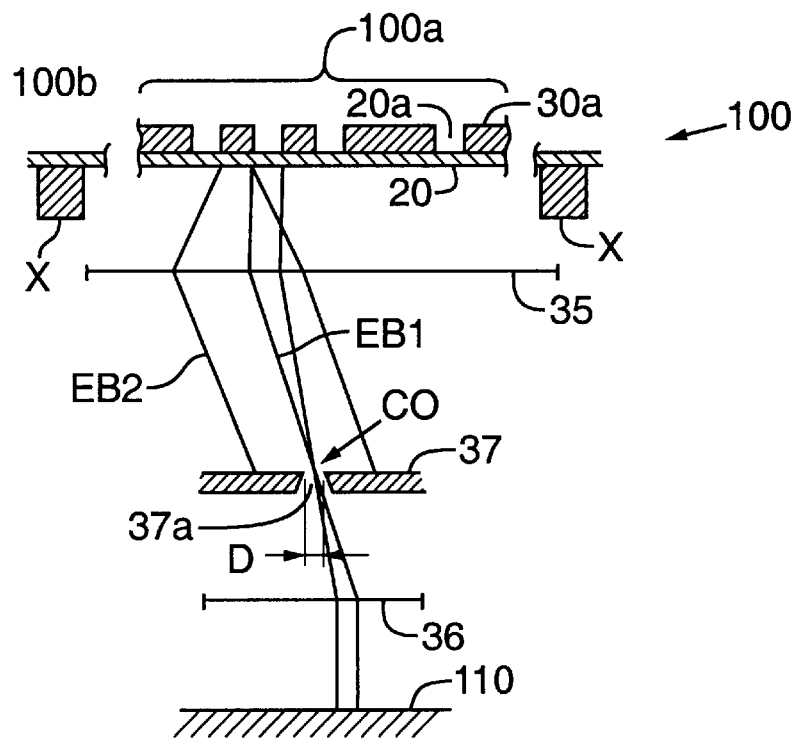
FIG. 4(b) (Prior Art)

MEMBERS FOR MASK PRODUCTION, MASKS, AND METHODS THEREOF FOR MANUFACTURING SAME

FIELD OF THE INVENTION

The present invention pertains to microlithography reticles and masks, substrates for manufacture of the reticles and masks, and methods for manufacture of the same.

BACKGROUND OF THE INVENTION

Recent developments in semiconductor integrated-circuit technology have been remarkable with the miniaturization of the constituent semiconductor elements and trends toward increased integrated-circuit density. Up to the present, so-called optical lithography steppers conventionally have been used for performing lithographic exposure (projection-transfer) of integrated-circuit patterns onto semiconductor wafers. Unfortunately, current optical lithography techniques are (or soon will be) unable to provide the image resolution necessary to satisfy anticipated demands for ever decreasing miniaturization of semiconductor elements and increases in integrated-circuit density. Consequently, effort has been expended to develop microlithographic equipment employing a charged particle beam (e.g., electron beam or ion beam) or an X-ray beam rather than a light (ultraviolet) beam. That is, a charged particle beam or X-ray beam is used to project a pattern, defined by a mask or reticle (both terms are used interchangeably herein), with demagnification, onto a sensitive substrate, such as a semiconductor wafer coated with a suitable resist.

Known types of masks used in conventional charged-particle-beam (CPB) projection-transfer systems are shown in FIGS. 3 and 4(a)–4(c).

The mask 21 of FIG. 3 is a typical "absorbing stencil mask." The absorbing stencil mask 21 comprises a silicon mask substrate 22 that defines through-holes 23. The through-holes 23, together with the remaining mask substrate 22, define a pattern. The mask substrate 22 has a thickness (e.g., 50 μm) sufficient to absorb charged particles from a charged particle beam EB used to irradiate the mask 21.

Charged particles in the charged particle beam EB irradiated onto the mask 21 pass only through the through-holes 23. Charged particles that pass through the through-holes are converged on a resist-coated surface of a suitable substrate 25 (e.g., a silicon wafer coated with a resist that is reactive to the charged particles). Thus, a pattern corresponding to the mask pattern is transferred onto the substrate 25.

The absorbing stencil mask of FIG. 3 has, at least, the following shortcomings: (1) a single absorbing stencil mask cannot form "island" or "peninsula" features; and (2) an absorbing stencil mask generates large amounts of heat causing heat deformation of the mask with consequent pattern distortion.

More specifically, because the mask substrate of an absorbing stencil mask is typically relatively thick, charged particles that are absorbed by the substrate (i.e., by portions of the substrate 22 where through-holes are absent) generate large amounts of heat. The heat causes significant deformation of the mask with consequent pattern distortion. In an absorbing stencil mask, if the absorbing portion of the substrate is made of a relatively thin membrane, the problems of heat deformation can be reduced significantly. However, a relatively thin membrane effectively cannot absorb the charged particles, resulting in transferred pattern images that have inadequate resolution.

The mask 100 of FIG. 4(b) is a "scattering transmission mask" in which the mask pattern is defined by a corresponding pattern of a scattering body 30a formed on the surface of a silicon mask substrate 20. The mask substrate 20 is configured as a membrane that is sufficiently thin to allow transmission of charged particles. When a charged particle beam irradiates the scattering transmission mask 100, charged particles passing through the scattering body 30a and the mask substrate 20 are forward-scattered and thus exhibit divergence from the mask (forming a "beam" EB2 indicated by a dashed line in FIG. 4(b)). Charged particles passing through the membrane 20, but not passing through the scattering body 30a, are not scattered significantly (forming a "beam" EB1 indicated by a solid line in FIG. 4(b)).

Referring to FIG. 4(b), the beam EB1 passes through a projection lens 35 that converges the beam EB1 at a crossover CO. An aperture plate 37 (defining an aperture 37a) is positioned typically at the crossover CO. The aperture plate 37 serves to block divergently scattered charged particles (such as many of the charged particles in the beam EB2). Blocking the divergently scattered charged particles allows formation of a high-resolution pattern image on a resist-coated surface of a suitable substrate 110 (e.g., a silicon wafer coated with a resist that is reactive to the charged particles).

The scattering transmission mask 100 of FIG. 4(b) generally is not subject to the problems associated with absorbing stencil masks. Specifically, the scattering body 30a is supported by the mask substrate (membrane) 20 of the scattering transmission mask 100. Therefore, such a mask can define peninsula or island features, such as the feature A shown in FIG. 4(a). Also, in the scattering transmission mask 100, it is unnecessary that the scattering body 30a completely shield the charged particle beam; this reduces the number of charged particles of the irradiating beam that are blocked by the mask. As a result, less heat is generated by charged particle irradiation of a scattering transmission mask than an absorbing stencil mask, and the scattering transmission mask does not experience the same extent of heat deformation as an absorbing stencil mask.

With a scattering transmission mask, the resolution of a projected pattern image may be improved by increasing the absorption and scattering of charged particles by the scattering body 30a. Alternatively, the resolution of the projected pattern image may be improved by reducing the extent of absorption and scattering of the charged particles by the mask substrate (membrane) 20. Accordingly, the thickness of the membrane of a conventional scattering transmission mask is typically about 10 μm. However, the temperature of the membrane still increases due to absorption of charged particles by the scattering body 30a. The temperature increase is sufficient to result in mask deformation and, consequently, pattern distortion.

For example, referring to FIG. 4(a), it is difficult to avoid heat being generated in feature A of the membrane 20 of the mask 100 due to the transfer of heat from the scattering body 30a. The portion of the scattering body 30a forming the feature A generates significant amounts of heat. Additionally, if the membrane 20 is too thin, then the membrane 20 will lack the strength to adequately support the scattering body 30a.

Accordingly, the membrane 20 typically is made relatively thin, but in a manner such that the membrane has adequate strength to support the scattering body 30a. To such end, a scattering transmission mask (or a scattering stencil mask) has been developed to include a membrane defining a pattern, wherein the pattern is divided into a plurality of small regions termed "mask subfields." The divided pattern includes non-pattern regions or "boundary regions" between the small regions. The mask further includes a support structure to support the membrane. The support structure may comprise a support grid of a comparatively rigid network of intersecting struts. The struts of the support grid are in registration with the boundary regions of the membrane.

For example, the scattering transmission mask 100 shown in FIGS. 4(a)–4(c) includes CPB-scattering bodies 30a formed on each of a plurality of mask subfields 100a on an upstream-facing surface of the membrane 20. Lattice-shaped struts X are in registration with boundary regions 100b on a downstream-facing surface of the membrane 20. Each mask subfield 100a defines a respective portion of a pattern to be transferred to the sensitive substrate 110. Typically, the subfields 100a of the mask collectively define the pattern of a single integrated circuit chip. During pattern transfer using a scattering transmission mask as shown in FIGS. 4(a)–4(c), a charged particle beam is scanned onto each mask subfield 100a and the respective pattern portions defined in the mask subfields 100a are projected sequentially, with demagnification, onto the sensitive substrate 110.

The X-ray transfer mask 11 shown in FIGS. 5(a) and 5(b) is provided with struts 13 on a downstream-facing surface of a mask membrane 12. The struts 13 support the mask membrane 12 and aid in conducting heat away from the membrane. The struts 13 also aid in preventing flexion and deformation of the mask membrane 12 arising from CPB irradiation or X-ray irradiation of the mask 11.

The mask membrane 12 is a relatively thin layer that allows transmission of X-rays. The mask 11 further comprises an X-ray-absorbing body 14 and an X-ray-shielding body 15 on the upstream-facing surface of the mask membrane 12. The mask membrane 12 is divided into a plurality of mask subfields 12a defining respective portions of the mask pattern to be transferred. During pattern transfer, an X-ray beam is scanned sequentially onto each mask subfield 12a. The respective pattern portions defined in the subfields 12a are transferred sequentially, with demagnification, to a sensitive substrate 17.

FIGS. 6(a)–6(d) show certain steps of a conventional manufacturing method for making a membrane of any of the above-described masks. A semiconductor wafer typically is used to form the mask substrate. For ease of discussion, the manufacture of one mask subfield S and two struts H are described; the entire mask membrane includes a plurality of such mask subfields S and struts H.

A substrate 1, comprising a silicon base 2, a first silicon-oxide layer 3, and a silicon layer 4 is provided (FIG. 6(a)). The substrate 1 shown in FIG. 6(a) is formed by heating the silicon base 2, the first silicon oxide layer 3, and the silicon layer 4 to a temperature ranging from about 1000° to about 2000° Celsius. Such heating fuses the silicon base 2 to the silicon layer 4 via the first silicon oxide layer 3.

A second silicon oxide layer 5 is then formed (typically at a thickness of about 10 µm) on a downstream-facing surface of the silicon base 2. The second silicon oxide layer 5 acts as an etch mask during subsequent dry etching of the silicon base 2. Next, a portion of the second silicon oxide layer 5 is etched to form an opening 6 (FIG. 6(b)). The silicon base 2 is then dry etched to the first silicon oxide layer 3. Thus, the first silicon oxide layer 3 and the silicon layer 4 are supported by remaining silicon struts H to form a body defining an opening K between the struts (FIG. 6(c)). A portion of the first silicon oxide layer 3 at the opening K is then removed to expose a portion of the silicon layer 4 as a membrane 4' (FIG. 6 (d)). Lastly, a CPB mask is formed by patterning the membrane 4'.

As discussed above, the substrate 1 is formed by heating the silicon base 2, the first silicon oxide layer 3, and the silicon layer 4 to fuse the layers together. However, after such thermal fusion and after the temperature returns to normal (i.e., room temperature), the difference in the coefficients of thermal expansion between the silicon layer 4 and the first silicon oxide layer 3 causes residual compressive stress in the silicon layer 4. The compressive stress experienced by the silicon layer 4 causes flexion of the resulting membrane 4'. As a result, deformations or cracks may occur in the pattern formed on the membrane 4' due to tensile stress. Such flexion, deformations, and cracks in the membrane 4' cause corresponding pattern distortions, resulting in poor pattern-image transfer.

Accordingly, there is a need for a mask that is substantially free of flexion caused by compressive stress and pattern deformation and cracks caused by tensile stress. There is also a need for a substrate for forming such a mask and for manufacturing methods for the same.

SUMMARY OF THE INVENTION

In light of the foregoing deficiencies in the prior art, the present invention provides charged-particle-beam (CPB) masks, substrates for forming such masks, and methods for manufacturing the same. In any of various embodiments, the mask substrate comprises a thin membrane made of a crystalline substance such as silicon and containing an impurity ("dopant"). The impurity has an atomic radius that is smaller than the atomic radius of the atoms of the crystalline substance. The substrate further preferably comprises struts integrally connected to the membrane for support of the mask.

Any of various embodiments of masks according to the present invention comprises a mask substrate as summarized above, wherein the membrane defines a mask pattern. The mask pattern preferably is divided into a plurality of mask subfields. Each mask subfield defines a respective portion of the overall mask pattern to be transferred to the substrate. Each mask subfield preferably is separated from neighboring subfields by intervening boundary regions. The boundary regions do not define any portion of the mask pattern. Such a mask further can comprise a support structure to support the membrane. The support structure is comprised of a plurality of struts, the struts intersecting each other to form a comparatively rigid support grid. Each strut is in registration with the corresponding boundary region of the membrane.

Additionally, the present invention provides methods for manufacturing mask substrates and masks.

The foregoing and other objects, features, and advantages of the invention will become more apparent from the following detailed description of preferred embodiments that proceeds with reference to the accompanying drawings.

BRIEF DESCRIPTION OF THE DRAWINGS

FIG. 4(a) is a partial plan view of a conventional scattering-transmission mask.

FIG. 4(b) is a partial schematic elevational section of the conventional scattering-transmission mask shown in FIG. 4(a).

FIG. 4(c) is a partial perspective view of the conventional scattering-transmission mask shown in FIG. 4(a).

DESCRIPTION OF THE INVENTION

The present invention provides charged-particle-beam (CPB) masks, substrates for forming such masks, and methods for manufacturing the same.

A mask substrate according to the present invention comprises a thin membrane made of a crystalline material (e.g., silicon) and containing an impurity ("dopant"). Atoms of the impurity have atomic radii that are smaller than the atomic radii of the atoms of the crystalline substance. The mask substrate further preferably comprises struts integrally connected to the mask membrane to support the mask membrane.

A mask according to the present invention comprises a mask substrate as summarized above. The mask defines a pattern formed on the membrane of the substrate. The mask pattern formed preferably is divided into a plurality of mask subfields. Each mask subfield comprises a respective portion of the overall mask pattern to be transferred from the mask to the substrate. Each subfield is separated from its neighboring subfields by intervening boundary regions. The boundary regions do not define any portion of the mask pattern. The mask preferably further comprises a support structure to support the membrane. The support structure is configured preferably as a comparatively rigid network of intersecting struts. The struts are in registration with the boundary regions.

Figure 2A:
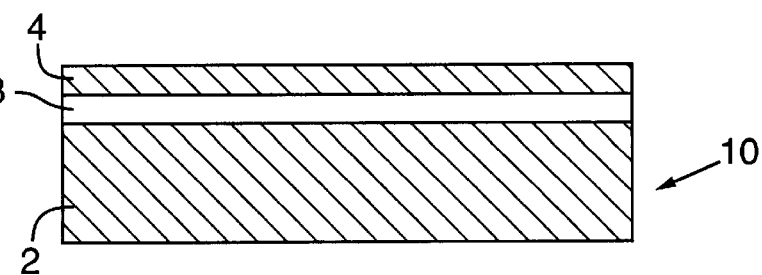
FIGS. 2(a)–2(e) show, in respective schematic elevational sections, certain steps of an embodiment of a method for forming a mask substrate according to the present invention.
Figure 2B:
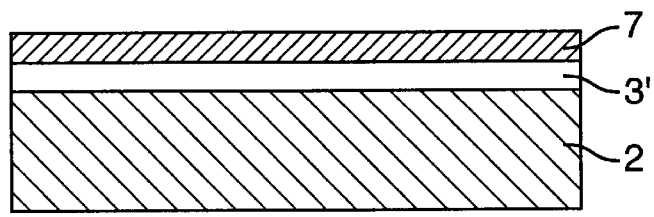
Figure 2C:
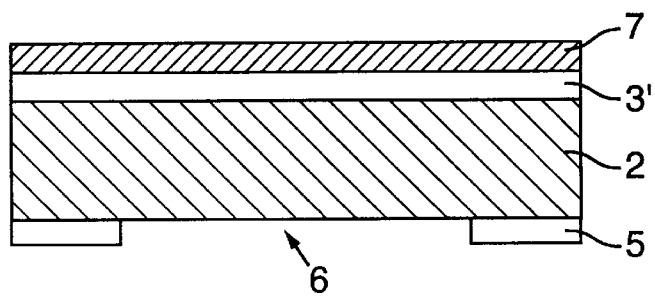
Figure 2D:
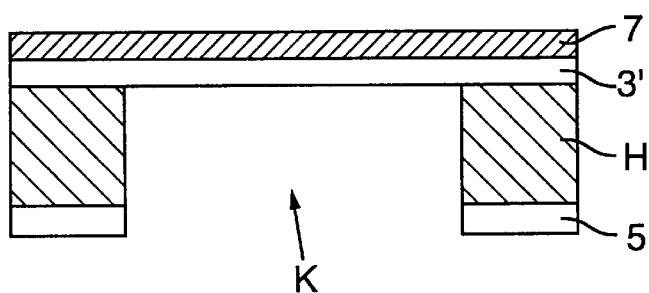
Figure 2E:
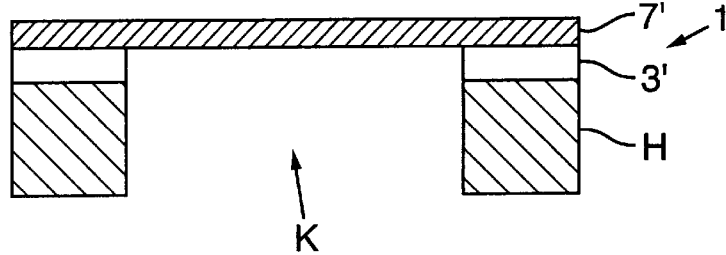
Figure 5A:
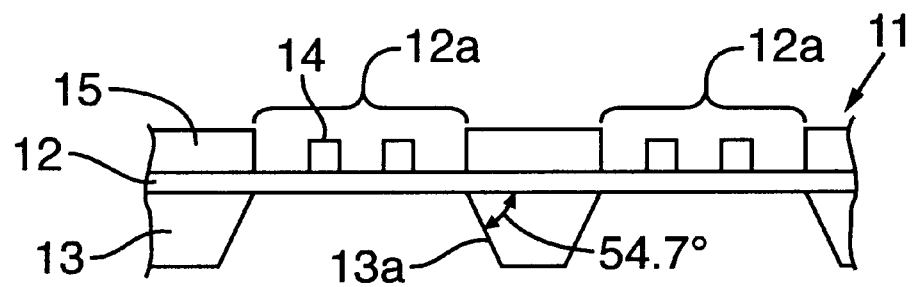
FIG. 5(a) is a partial schematic elevational section of a conventional X-ray transfer mask.
Figure 5B:
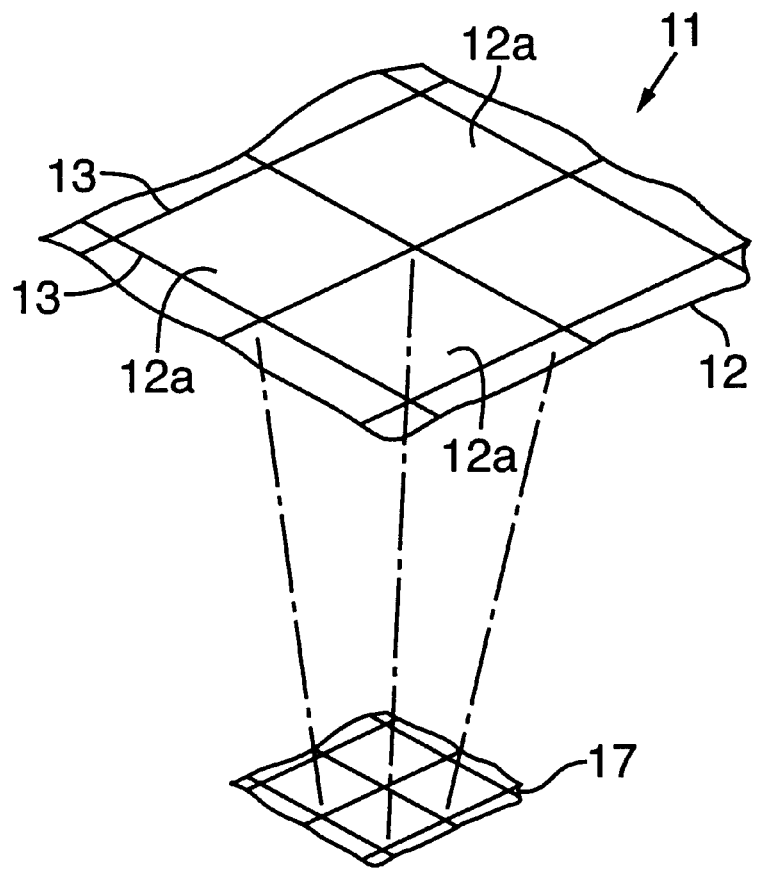
FIG. 5(b) is a partial perspective view of the conventional X-ray transfer mask shown in FIG. 5(a).
Figure 6A:
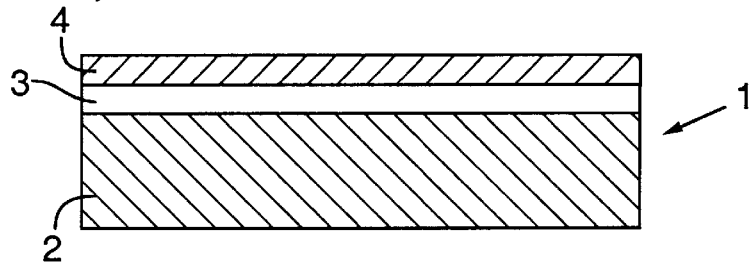
FIGS. 6(a)–6(d) show, in respective schematic elevational sections, certain steps of a conventional method for forming a mask substrate of an absorbing stencil mask.
Figure 6B:
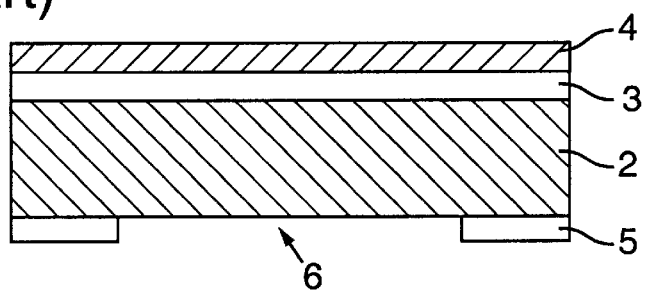
Figure 6C:
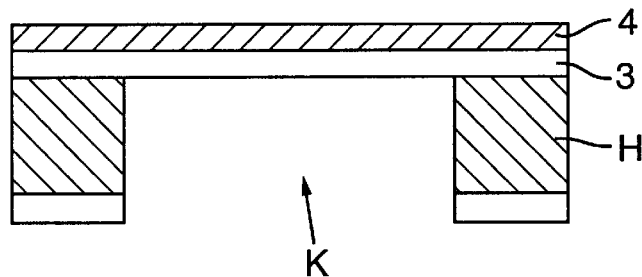
Figure 6D:
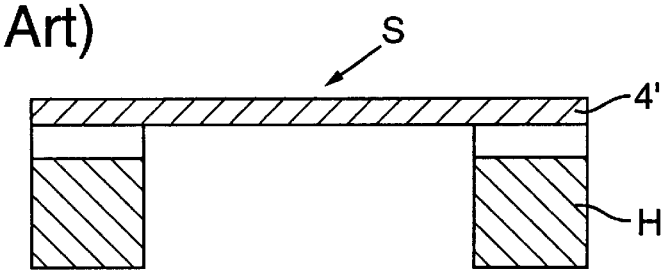

More specifically, referring to FIG. 2(e), a mask substrate 1 according to the present invention preferably comprises a thin membrane 7', preferably made of silicon (or other suitable crystalline material), in which atoms of an impurity have been incorporated, such as by diffusion. The atoms of the impurity have atomic radii that are smaller than the atomic radii of the silicon atoms forming the membrane 7'. The mask substrate 1 preferably further comprises struts H thermally fused to the membrane 7' by an intervening fusing layer 3', for supporting the membrane. For a silicon membrane, the impurity is selected from the group consisting of boron, carbon, phosphorus, and mixtures thereof.

The impurity preferably is diffused into the membrane 7' using a "substitution diffusion" method. Substitution diffusion places or diffuses an atom of the impurity into the membrane crystal lattice at a location point of the crystal-lattice in place of the original atom at that location. Alternatively, an "invasion diffusion" method may be used to diffuse atoms of the impurity into the silicon membrane 7' in positions between the point positions of original crystal-lattice atoms. Typically the appropriate method of diffusion is determined based upon the membrane material and the selected impurity.

For example, in a first embodiment of the mask substrate of the present invention, boron is diffused into a thin silicon membrane using substitution diffusion. According to Gilifalco, *Diffusion of Atoms Into Crystals,* Kyoritsu Publishing (1980), the atomic radius of a silicon atom is 1.17 Å and the atomic radius of a boron atom is 0.88 Å. Because the atomic radius of boron is only 75% of the atomic radius of silicon, tension typically arises about neighboring silicon atoms when boron atoms are substituted into the lattice points of a silicon crystal, generating tensile stress in the mask substrate. In other words, a predetermined amount of tensile stress may be generated between silicon atoms in a crystalline-silicon membrane 7' by substituting an impurity into the silicon crystal, particularly whenever the impurity comprises atoms having an atomic radius that is smaller than the atomic radius of atoms of the silicon membrane.

In second and third embodiments of a mask substrate according to the present invention, phosphorous and carbon can be diffused into a silicon membrane 7'. The atomic radius of a phosphorus atom is 1.10 Å (i.e., 94% of the atomic radius of a silicon atom) and the atomic radius of a carbon atom is 0.66 Å (i.e., 66% of the atomic radius of a silicon atom). Because the respective atomic radii of phosphorous and carbon are smaller than the atomic radius of a silicon atom, these impurities can be substituted into the silicon membrane 7' to create a desired amount of tensile stress within the membrane.

Creating tensile stress within the membrane 7' (as described above) increases with increases in the concentration of the impurity within the membrane. For example, if $1\times10^{20}$ atoms/cm$^3$ (about 0.1 atomic percent) of boron are introduced into monocrystalline silicon, a tensile stress of about 100 MPa can be generated within the monocrystalline structure.

As discussed above, a membrane of a mask substrate manufactured by thermal fusion exhibits a compressive stress caused by the difference in the coefficients of thermal expansion between the material comprising the membrane 7' and the material comprising the fusing layer 3'. The magnitude of the compressive stress exhibited by the membrane 7' depends upon the composition of the membrane and the conditions under which the mask substrate was manufactured. For example, for a silicon membrane 7' fused to a silicon support structure via a silicon oxide fusing layer 3', the typical range of compressive stress is in the range of about 30 MPa to about 300 MPa.

The tensile stress caused by substitution diffusion of atoms of an impurity into the membrane 7' (the impurity comprising atoms having an atomic radius smaller than the atomic radius of atoms of the membrane material) acts to cancel residual compressive stress within the membrane 7'. Thus, the present invention provides a substrate having a desired magnitude of tensile stress sufficient to cancel any compressive stress in the membrane, thereby substantially eliminating flexion of, deformation of, and cracks within the membrane. Because tensile stress of the membrane increases with an increase in the concentration of the impurity in the membrane, compressive stress within the membrane can be controlled in the mask substrate according to the present invention by regulating the concentration and type of impurity or impurities within the membrane.

An embodiment of a method, according to the present invention, for forming a mask substrate 1 according to the present invention is illustrated in FIGS. 2(a)–2(e). The method is illustrated with reference to a portion of the mask. A typical mask comprises a plurality of such portions. Further, by way of example, the membrane 7' of the mask substrate 1 is described as comprising silicon and the mask substrate is described as comprising, inter alia, a silicon oxide fusing layer 3 for fusing the membrane 7' to a silicon support 2. It will be understood that each of the membrane 7', support 2, and fusing layer 3 may comprise any of various other suitable materials known to those persons skilled in the relevant art.

Referring to FIG. 2(*a*), manufacture of the mask substrate 1 begins with a laminated member 10 comprising a silicon support 2, a first silicon oxide layer 3, and a thin silicon layer 4. The laminated member 10 is formed by superposing a first silicon oxide fusing layer 3 on a silicon support layer 2, and superposing a silicon and a thin silicon layer 4 on the fusing layer 3. The resulting laminate is heated to a temperature of about 1000° to about 2000° Celsius to thermally fuse the layers together via the fusing layer 3.

Between the steps shown in FIGS. 2(*a*)–2(*b*), the thin silicon layer 4 is diffused with an impurity to form a diffused silicon layer 7. The impurity has atoms (e.g., boron) having an atomic radius smaller than the atomic radius of a silicon atom. If the impurity is boron, the silicon layer 4 is preferably diffused with about $5 \times 10^{20}$ atoms/cm$^3$ (i.e., about 0.5 atomic percent) boron.

Between the steps shown in FIGS. 2(*b*)–2(*c*), a second silicon oxide layer 5 is formed (typically at a thickness of about 10 $\mu$m) on the lower surface of the silicon support 2. The second silicon oxide layer 5 will act as an etch mask for use during subsequent etching of the silicon support 2. To such end, a portion of the second silicon oxide layer 5 preferably is dry etched to form an opening 6 (FIG. 2(*c*)). Specifically, the silicon oxide layer 5 acts as a mask defining the portions of the silicon support 2 that ultimately will form struts H. The silicon support 2 is dry etched to the silicon oxide layer 3 utilizing selective differences in etching sensitivity of the silicon support 2 versus the second silicon oxide layer 5.

The etching of the silicon support 2 is not limited to etching methods exploiting different etch sensitivities of the silicon support 2 versus the silicon oxide layer 5 (i.e., the etching mask) versus the silicon oxide layer 3 (i.e., the etching stop). Such etching is isotropic, resulting in struts H having sloped sides, as discussed below. For an anisotropic etch process (yielding struts H having sides perpendicular to the membrane surface), a plasma etch process or a low-temperature ion etch process may be used to etch the silicon support 2. Anisotropic etching ensures that the walls of the struts H are perpendicular to the surface of the membrane 7'. As discussed below, struts having walls that are substantially perpendicular to the membrane surface provide a substrate for forming a mask, wherein the area occupied by boundary regions is reduced (hence, the size of the resulting mask is reduced).

The silicon oxide layer 3 acts as an etch stop as the silicon support layer 2 is etched away to form an opening K (FIG. 2(*d*)). The silicon oxide layer 3 and the diffused silicon layer 7 are supported by struts H to form a fused structure having openings K between the struts. In this manner, a mask substrate is made comprising two layers of thin membranes, i.e., the diffused silicon layer 7 (containing a relatively high concentration of boron) and the silicon oxide layer 3 (FIG. 2 (*d*)). Portions of the silicon oxide layer 3 at the openings K then are removed to expose respective portions of the diffused silicon layer 7, thereby forming a membrane 7' extending between the struts H and thus completing manufacture of a completed mask substrate 1 (FIG. 2(*e*)). The silicon oxide layer 3 may be etched in any suitable manner known to those persons skilled in the art, for example, by a wet chemical etch using hydrofluoric acid.

Figure 1:
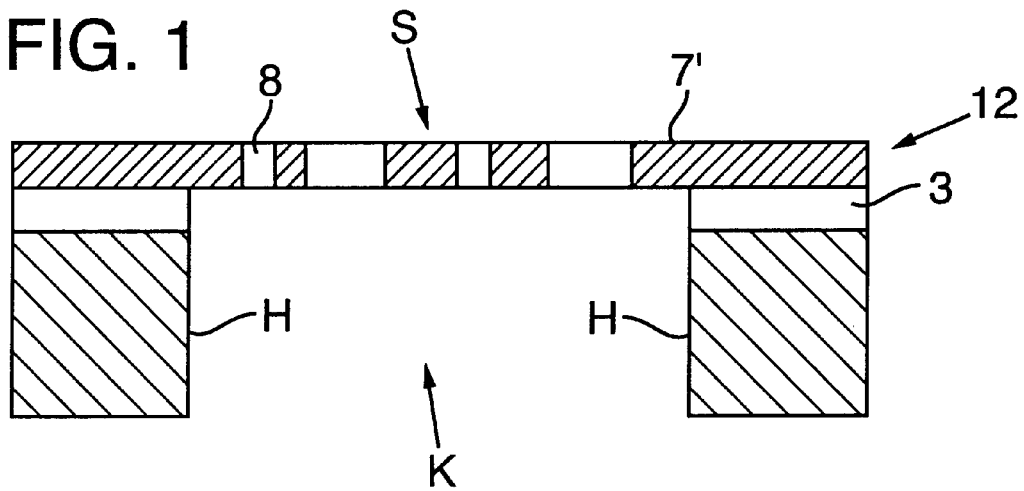
FIG. 1 is a schematic elevational section of an embodiment of a charged-particle-beam (CPB) mask according to the present invention.
Figure 3:
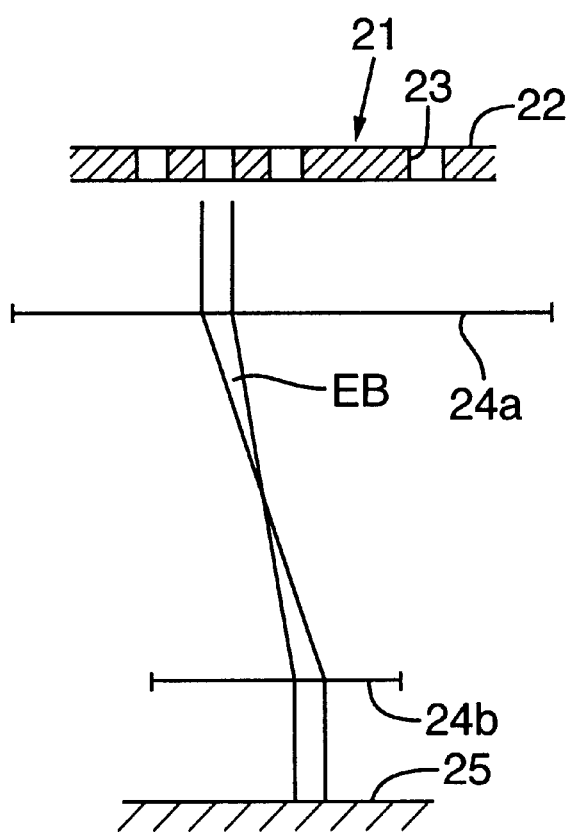
FIG. 3 shows, in schematic elevational sections, a conventional absorbing stencil mask and certain principles associated with its use.

The struts H are formed preferably by anisotropic etching. Thus, the struts are formed with walls that are substantially perpendicular to the downstream-facing surface of the membrane 7' (see FIGS. 1 and 2(*d*)–2(*e*)). Consequently, the base of each strut H has less width than the base width of struts formed by isotropic etching (which forms struts having walls that are sloped relative to the downstream-facing surface of the membrane. Hence, with an anisotropic etch, the area of the boundary regions (i.e., non-pattern regions) can be reduced, allowing manufacture of a smaller mask overall. As a result, typical adverse effects accompanying use of larger masks, such as larger field magnification of the optical system used to irradiate the mask and increases in the movable range of the mask stage, are minimized using a mask according to the present invention. Use of a smaller mask reduces deflection distortion (when using a divided-transfer method), and allows more precise pattern transfer and denser circuit integration.

The present invention also provides masks each comprising a mask substrate according to the present invention and a pattern defined on the mask membrane. The mask pattern is preferably divided into a plurality of mask subfields. Each mask subfield is separated from its neighboring subfields by intervening boundary regions. The boundary regions do not define any portion of the mask pattern to be transferred. Each subfield comprises a respective portion of the overall mask pattern. The mask further comprises a support structure comprising a plurality of struts H to support the membrane (FIGS. 1 and 2(*e*)). The struts H are in registration with the boundary regions.

A stencil pattern is etched and/or transferred preferably onto the downstream surface of the mask membrane, preferably by anisotropic etching. A plasma etching process or a very low-temperature-response ion-etching process may be employed for performing anisotropic etching.

As discussed above, in conventional masks formed from "pure" substrates (i.e., substrates lacking an impurity), the membrane exhibits flex due to compressive stress within the substrate. However, in a mask according to the present invention, tensile and compressive stress are effectively canceled. Accordingly, flexion of the mask membrane is suppressed and positional shifting of the pattern due to residual compressive stress is minimized. That is, with a mask according to the present invention, membrane flex caused by compressive stress and pattern deformation caused by tensile stress are substantially or completely eliminated.

Whereas the invention has been described with reference to particular embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A mask substrate for forming a mask for charged-particle-beam microlithography, comprising: (a) a monocrystalline silicon membrane comprising a lattice of silicon atoms each having an atomic radius, the lattice also comprising atoms of an impurity diffused into the lattice, the impurity being selected from the group consisting of boron, carbon, phosphorus, and mixtures thereof; and (b) a support grid comprising intersecting struts, the support grid having a membrane-facing portion and an opposing surface, the membrane-facing portion being integral with the membrane so as to provide support for the membrane, wherein a concentration of the impurity diffused into the lattice is sufficient to reduce stress in the membrane produced by the support grid.

2. The mask substrate of claim 1, wherein the impurity comprises boron.

3. The mask substrate of claim 2, wherein the boron in the monocrystalline silicon membrane is at a concentration of about $1 \times 10^{20}$ atoms/cm$^3$.

4. The mask substrate of claim 2, wherein the monocrystalline silicon membrane comprises about 0.1 atomic percent boron.

5. The mask substrate of claim 1, wherein the intersecting struts include a supporting layer and a fusing layer of silicon oxide, the fusing layer of silicon oxide being situated between the supporting layer and the silicon membrane.

6. The mask substrate of claim 5, wherein the impurity comprises boron.

7. The mask substrate of claim 6, wherein the boron in the monocrystalline silicon membrane is at a concentration of about $1 \times 10^{20}$ atoms/cm$^3$.

8. The mask substrate of claim 6, wherein the monocrystalline silicon membrane comprises about 0.1 atomic percent boron.

9. A mask for exposing a pattern onto a sensitive semiconductor wafer using a charged particle beam, the mask comprising: (a) a monocrystalline silicon membrane defining a mask pattern, the pattern being divided into a plurality of mask subfields each defining a respective portion of the mask pattern through which a charged particle beam may pass, the monocrystalline silicon membrane comprising a crystalline lattice of silicon atoms each having an atomic radius, the lattice also comprising atoms of an impurity diffused into the lattice, the impurity being selected from a group consisting of boron, carbon, phosphorus, and mixtures thereof; (b) a respective boundary region situated between each mask subfield; and (c) a support grid having a membrane-facing portion and an opposing surface, the support grid being attached to the membrane at the boundary regions so as to support the membrane, wherein a concentration of the impurity diffused into the lattice is sufficient to reduce stress in the membrane produced by the support grid.

10. The mask of claim 9, wherein the impurity diffused therein comprises boron.

11. The mask of claim 9, wherein the boron is at a concentration in the monocrystalline silicon membrane of about $1 \times 10^{20}$ atoms/cm$^3$.

12. The mask of claim 9, wherein the monocrystalline silicon membrane comprises about 0.1 atomic percent boron.

13. The mask substrate of claim 9, wherein the intersecting struts include a supporting layer and a fused layer of silicon oxide, the fused layer of silicon oxide being situated between the supporting layer and the silicon membrane.

14. A method of fabricating a mask substrate for forming a mask for charged-particle-beam microlithography, the method comprising:

(a) providing a support layer;

(b) superposing on the support layer a fusing layer, and superposing on the fusing layer a monocrystalline silicon membrane comprising a lattice of silicon atoms;

(c) diffusing atoms of an impurity into the monocrystalline silicon membrane layer, the atoms of the impurity being selected from the group consisting of boron, carbon, phosphorus, and mixtures thereof, wherein a concentration of the impurity is selected to reduce a stress in the membrane produced by the fusing layer, the support layer, or both;

(d) removing a portion of the support layer to expose a portion of the fusing layer while forming, from remaining portions of the support layer, struts for supporting the monocrystalline silicon membrane layer; and (e) removing a portion of the fusing layer to expose portions of the monocrystalline silicon membrane extending between the struts.

15. The method of claim 14, wherein, in step (d), the portion of the support layer is removed by anisotropic etching.

16. The method of claim 14, wherein, in step (c), the impurity is boron that is diffused into the monocrystalline silicon membrane at a concentration of about $1 \times 10^{20}$ atoms/cm$^3$.

17. A method of fabricating a mask for microlithographically exposing a pattern onto a semiconductor wafer using a charged particle beam, the method comprising:

(a) providing a support layer;

(b) superposedly forming on the support layer a fusing layer, and superposedly forming on the fusing layer a monocrystalline silicon membrane layer, the monocrystalline silicon membrane layer comprising a lattice of silicon atoms;

(c) diffusing atoms of an impurity into the monocrystalline silicon membrane layer, the atoms of the impurity being selected from a group consisting of boron, carbon, phosphorus, and mixtures thereof, wherein a concentration of the impurity is selected to reduce a stress in the membrane produced by either the fusing layer, the support layer, or both the fusing layer and the support layer;

(d) removing a portion of the support layer to expose a portion of the fusing layer while forming, from remaining portions of the support member, struts for supporting the monocrystalline silicon membrane layer;

(e) removing a portion of the fusing layer to expose portions of the monocrystalline silicon membrane extending between the struts; and (f) etching the monocrystalline silicon membrane layer to define a pattern in the monocrystalline silicon membrane.

18. The method of claim 17, wherein the pattern is anisotropically etched on the membrane layer.

19. A mask substrate, comprising:

a silicon membrane;

intersecting struts that support the silicon membrane, the struts including a supporting layer and a fusing layer of silicon oxide, wherein the fusing layer is situated between the supporting layer and the silicon membrane; and an impurity diffused into the silicon membrane in a concentration sufficient to reduce a stress in the silicon membrane produced by either the fusing layer, the supporting layer, or both.

* * * * *